July 28, 1964 W. B. WARREN 3,142,783

ELECTRICAL CIRCUIT SYSTEM

Filed Dec. 22, 1959 3 Sheets-Sheet 1

WILLIAM B. WARREN,
INVENTOR

BY Charles S. Haughey
ATTORNEY

July 28, 1964 W. B. WARREN 3,142,783

ELECTRICAL CIRCUIT SYSTEM

Filed Dec. 22, 1959 3 Sheets-Sheet 2

WILLIAM B. WARREN,
INVENTOR

BY Charles S Haughey
ATTORNEY

July 28, 1964 W. B. WARREN 3,142,783

ELECTRICAL CIRCUIT SYSTEM

Filed Dec. 22, 1959 3 Sheets-Sheet 3

WILLIAM B. WARREN,
INVENTOR

BY Charles A. Haughey
ATTORNEY

United States Patent Office 3,142,783

Patented July 28, 1964

3,142,783

ELECTRICAL CIRCUIT SYSTEM

William B. Warren, Costa Mesa, Calif., assignor to Hughes Aircraft Company, Culver City, Calif., a corporation of Delaware Filed Dec. 22, 1959, Ser. No. 861,277
6 Claims. (Cl. 317—101)

This invention relates to a system for assembling miniaturized electrical components and electrically interconnecting them into circuit subassemblies or assemblies. This system is particularly designed for the accommodation into electrical circuits of both passive and active electrical components or devices, such as resistors, capacitors and semiconductors.

In the field of miniaturized components it is possible to make individual components so small that ordinary systems for interconnecting the components will occupy more volume than the devices. Attempts to reduce the volume so occupied have been primarily directed to printed and etched circuit techniques, thin film work, and packaging several components in a single, sealed package. In such techniques considerable difficulty has been encountered in physically holding the components, in orienting components with respect to circuit leads, and in making electrical connections to the devices and to circuit leads for external connections.

It is a principal object and advantage of this invention to provide a circuit board assembly and technique which physically supports components within an insulating material, and physically retains the components by surface conductive sheets prepared on the insulating material prior to assembly; and further to assemble components between upper and lower circuit boards having pre-etched or preformed circuit conductive sheet patterns thereon, then to bond the upper and lower circuit boards to each other to form a container for the elements therein whose surface conductive sheet patterns both contain and electrically interconnect the elements. This assembly and attachment system is one which is particularly adapted to mass production and assembly of components in which circuits may be prepared before devices are incorporated, and which is adaptable to replacement or repair of defective components.

The above and other objects and advantages of this invention will be explained by or be made apparent from the following disclosure and the preferred embodiment of the invention as illustrated therein and in the drawings, in which.

Figure 1:
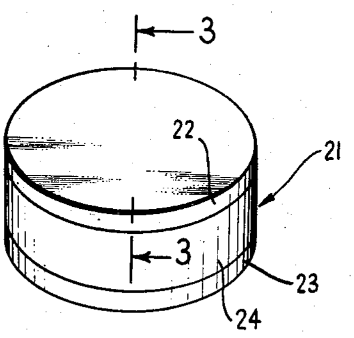
FIG. 1 is a perspective view of a diode.
Figure 3:
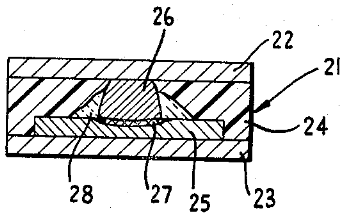
FIG. 3 is a sectional view of the diode of FIG. 1, taken on line 3—3 thereof.

The system of this invention is primarily directed to the accommodation of miniaturized semiconductor devices into compact circuit assemblies. The diode 21 of FIGS. 1 and 3 is particularly suited for this purpose, and includes electrodes 22 and 23 and intermediate insulative material 24. As shown in FIG. 3, a semiconductor crystal 25 is physically and electrically bonded to electrode 23 with a regrown region 27 on its opposite face electrically contacted by contact metal 26 which is in turn electrically connected to electrode 22. A first, high purity insulative material 28 is preferably bonded to the external surface of the junction between the regrown region 27 and the balance of the crystal, and a second insulative material 24 is then filled in between the electrodes 23 and 22. Suitable diodes have been prepared as above described having .050″ diameter and .030″ thickness with electrodes 22 and 23 .0075″ thick.

Figure 2:
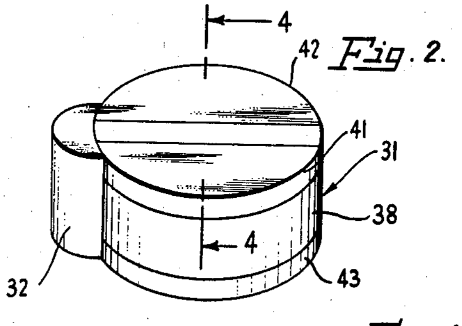
FIG. 2 is a perspective view of a transistor.
Figure 4:
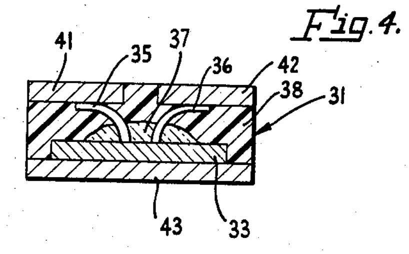
FIG. 4 is a sectional view of the transistor of FIG. 2, taken on line 4—4 thereof.

The transistor 31 of FIGS. 2 and 4 includes upper electrodes 41 and 42, lower electrode 43 with insulative material 38 therebetween. As shown in FIG. 4, a semiconductor crystal 33 is bonded electrically and mechanically to lower electrode 43, and leads 35, 36 are attached to its opposite surface. The particular internal structure of the transistor 31 is not shown, and may be of any desired type having opposed PN junctions and emitter, collector and base portions. A first, high purity insulative material 37 is shown about the lead attachment areas to cover exposed PN junction areas, and the balance of the volume between the electrodes 41, 42 and 43, as well as a lobe 32, is filled with insulative material 38. The lobe 32 is an indexing lobe, as will presently appear. It is also preferred to utilize magnetic material for either upper or lower electrodes of directional components and nonmagnetic electrodes opposite, for indexing or orienting purposes.

Other electrical components such as resistors, capacitors, and various other components with two or more electrodes may easily be accommodated to the circuit system of the invention to be described hereinafter. Where it is desired to attach more than one electrode at either the upper or lower surface of the device, an indexing lobe such as lobe 32 on the transistor 31 is preferably used to orient the electrodes.

A circuit system according to this invention uses an assembly of upper and lower circuit boards to contain and interconnect electrical components such as hereinbefore described.

Figure 5:
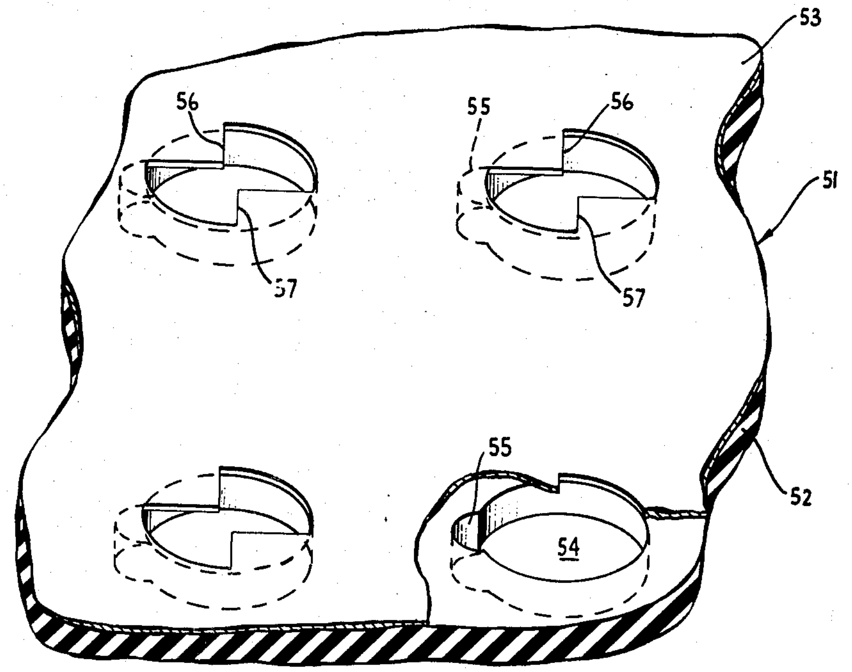
FIG. 5 is a perspective view of a portion of a circuit board.

In FIG. 5 a perspective view of a portion of an upper circuit board 51 is shown prior to preparation of a metallic sheet circuit pattern thereon. The board 51 initially comprises an insulative material 52 and a metallic electrically conductive sheet material 53. The insulative material 52 is provided with a regular pattern of holes therein of .050 inch diameter. These holes 54 have additional recesses 55 connecting therewith to accommodate indexing lobes thereon such as lobes 32 shown on the transistor of FIGS. 2 and 4. The metallic sheet conductor 53 includes attachment tabs 56, 57 overlying the holes 54 for attachments to component electrodes. The tabs 56, 57 may be of any shape, but preferably are spaced for independent electrical connection.

Figure 6:
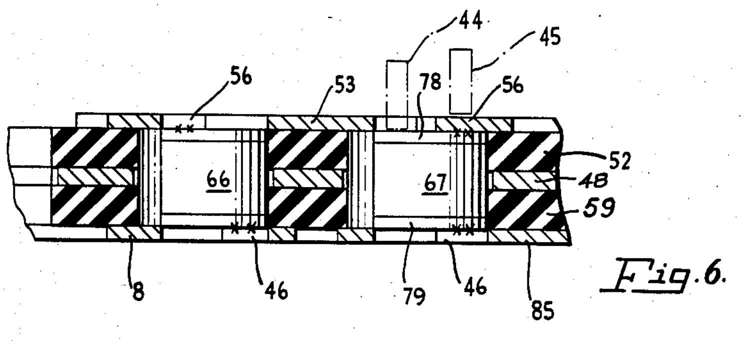
FIG. 6 is a sectional view of a circuit board assembly taken on line 6—6 of FIGS. 9 and 10.
Figure 7:
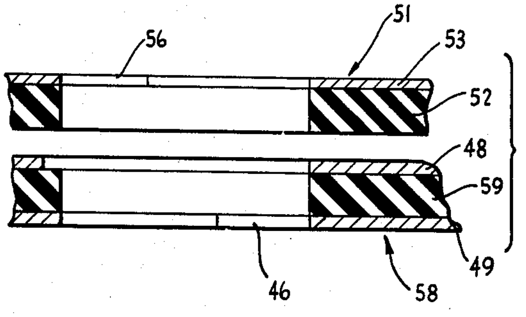
FIG. 7 is an exploded view of a portion of the circuit board assembly of FIG. 6 showing the manner of assembly.

In FIG. 6 a portion of a circuit board assembly is shown in section with resistors 66 and 67 therein. As shown in FIG. 7, the assembly comprises an upper board 51 and a lower board 58 each of which has been pretreated to provide an electrical circuit conducting path on the respective outer surfaces. The upper board 51 initially comprises an electrically conductive sheet of copper 53 and an insulative sheet 52 preferably of a fluorocarbon plastic which has the property of bonding under heat and pressure to an oxidized copper surface. The lower board 58 is comprised of a layer of fluorocarbon insulating plastic 59 sandwiched in between a pair of metallic sheets 48 and 49. Each of the boards 51 and 58 is prepared by first forming a pattern of holes through the insulative sheets 52 and 59, and a corresponding pattern of holes through the electrically conductive sheets 53, 48 and 49. Conductive sheet 53 is then bonded to insulative sheet 52, and insulative sheet 59 is bonded between conductive sheets 48 and 49. The holes in the respective sheets are aligned so that, upon bonding the upper board 51 to the lower board 58, the respective holes will be properly aligned to receive devices. In the assembly of FIG. 7, the holes in sheets 52 and 59 are of equal diameter and they are axially aligned. The corresponding hole in sheet 48 is axially aligned with the holes in sheets 52 and 59, but is preferably of a larger diameter to simplify assembly. The holes in sheets 53 and 49 are of the same diameter as those in sheets 52 and 59, except that tab 56 in sheet 53 and tab 46 in sheet 49 extend over the hole for attachment to a device within the hole. For clarity, the device 66 is not shown in the view of FIG. 7.

Before bonding an upper board 51 to a lower board 58 the desired electrical conducting pattern is etched or otherwise formed into the respective sheets 53 and 49 as hereinbefore noted. Appropriate devices are placed within the recesses of the lower board 58. The upper board 51 is then aligned with the lower board and bonded thereto in any suitable manner. When the sheet 52 is a suitable fluorocarbon and the exposed surface of sheet 48 is oxidized copper, the bond between the two is suitably formed by application of pressure across the surface of the board at a temperature of about 200° C. Where desired, the copper sheet 48 may be replaced with an insulating bonding sheet, or the sheets 52 and 58 may be bonded to each other, to avoid capacitative effects. The devices are then electrically connected to the respective tabs, the preferred connection being made by a weld between the tabs and the respective electrode surfaces of the devices. This weld may be formed by a pair of parallel electrodes contacting adjacent portions of a tab and its corresponding electrode. In this manner an upper tab 56 shown in FIG. 6 is welded to an upper electrode 78 of the resistor 67 by welding electrodes 44, 45, shown in dashed lines, and a lower tab 46 is similarly welded to a lower electrode 79 of the resistor.

Figure 8:
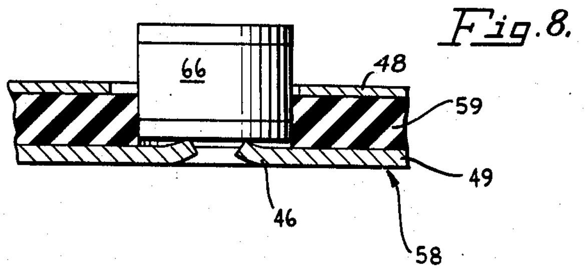
FIG. 8 shows a detailed view of a method of making contact in the assembly of FIG. 6.
Figure 9:
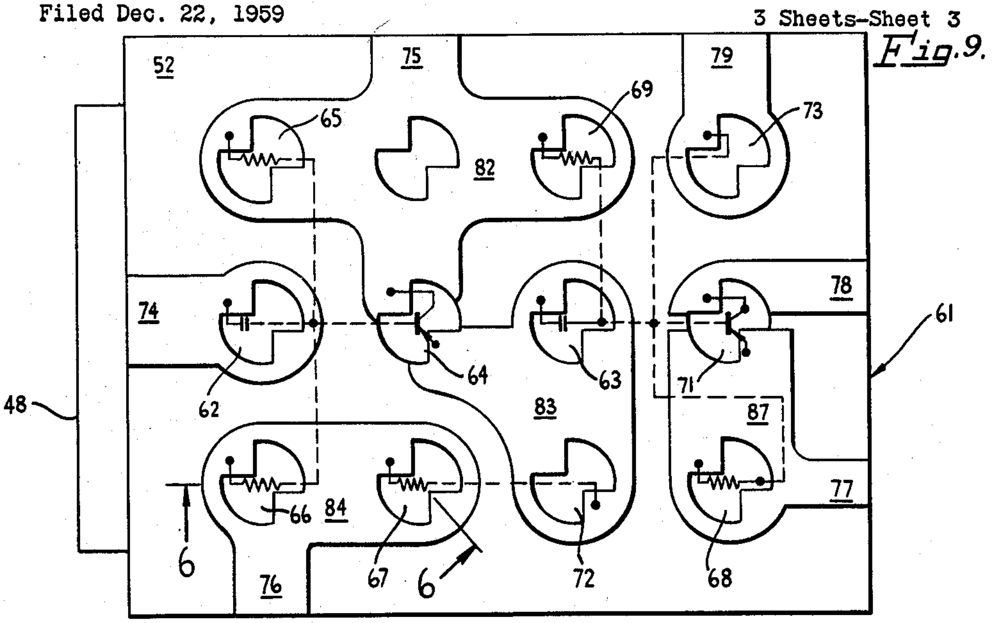
FIG. 9 is a plan view of a circuit board assembly having circuit conductive elements and component connective means formed thereon, and a schematic circuit diagram superimposed.
Figures 10, 11:
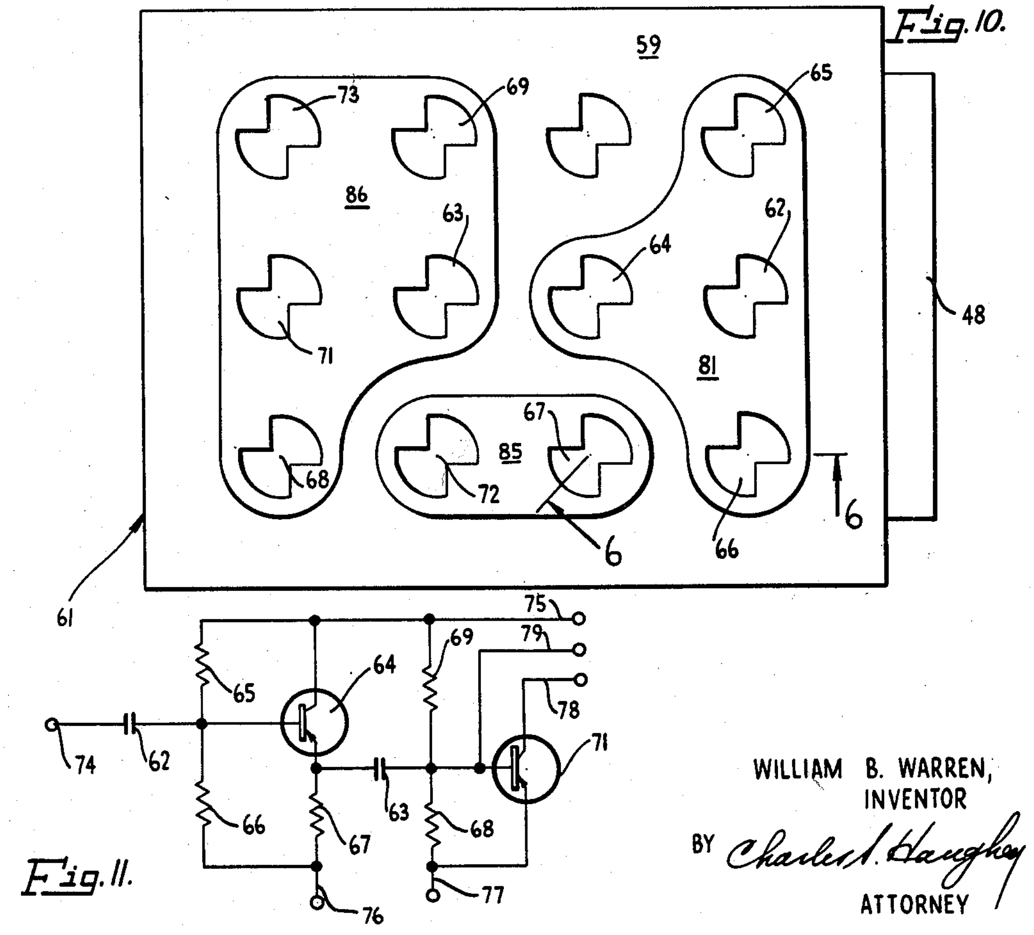
FIG. 10 is a reverse plan view of the circuit board assembly of FIG. 9 having conductive elements thereon to match those shown in FIG. 9.
FIG. 11 is a circuit diagram in conventional form corresponding to that superimposed on FIG. 9.

FIG. 8 shows another method of electrically connecting circuit board tabs to component electrodes by initially dimpling the tabs 46 inwardly toward the center of the hole in the circuit board 58, and then applying pressure to the respective circuit boards in assembly to obtain contact between the dimpled tabs and the device electrodes. They may additionally be welded as hereinbefore described FIG. 9 shows an upper plan view of a circuit board assembly according to FIG. 6 having incorporated therein suitable transistors, resistors, and capacitors to produce a circuit subassembly more clearly shown schematically in FIG. 11. The electrically conductive upper sheet of the assembly as shown in FIG. 9 has been etched to provide electrically conductive leads between components to be retained in the holes of the circuit board assembly 61, and an electrically conductive lower sheet of the lower board 58, as shown in FIG. 10 viewed from the reverse side of the assembly, has also been etched to provide the desired circuit pattern. The view of FIG. 10 is taken as though hinged along its left vertical side from the right vertical side of FIG. 9, so that FIG. 9 is a left hand view and FIG. 10 is a right hand view. Thus the components in the left hand vertical row of holes of FIG. 9 are the components shown in the right hand vertical row of holes in FIG. 10.

A circuit diagram corresponding to that of FIG. 11 has been superimposed on FIG. 9, so that connections to the electrically conductive material shown on the top of the circuit board 61 assembly in FIG. 9 are shown in solid lines, and connections from the components to the bottom side electrically conductive material are shown in dotted lines. Thus the circuit in the assembly 61 comprises capacitor 62 connected to a terminal 74 which was etched from the initial sheet 53 of FIG. 7. The capacitor 62 is connected from its bottom electrode surface to a portion 81 of the electrically conductive sheet 49 of the lower board of FIG. 7. Electrically conductive portion 81 forms an electrical connection from capacitor 62 to resistors 65 and 66, to capacitor 62, and to the base connection of transistor 64. An electrically conductive portion 82 of the original upper sheet forms an electrical connection from the collector of transistor 64 to an electrode terminal of resistor 65, an electrode terminal of a resistor 69, and to a terminal 75. A second portion 83 of the electrically conductive upper sheet forms an electrical connection from the emitter of transistor 64 to a capacitor 63 and the conductive plug 72. Resistor 66 is electrically connected through portion 84 of original sheet 53 to a terminal 76, and to a resistor 67, which is in turn connected through a portion 85 of original sheet 49 to the plug 72. The capacitor 63 is connected through a portion 86 of original sheet 49 to the base contact of a transistor 71, to resistor 69, to resistor 68, and to a plug 73 which is in turn connected to a terminal 79 formed from the original sheet 53. The emitter of transistor 71 is connected through a portion 87 of original sheet 53 to an electrode of resistor 68, and to a terminal 77. The collector of the transistor 71 is electrically connected to a terminal 78 formed from the original sheet 53.

It will be observed that the circuit assembly hereinbefore described constitutes an amplifier element formed into a board having 12 holes utilizing 9 of the holes for electrical components. Two additional holes are utilized for electrically conductive plugs, leaving one hole empty. This amplifier element is easily connected to other circuit elements through the respective terminals 74, 75, 76, 77, 78 and 79. If preferred, some terminals may be provided on the reverse side of the assembly.

In the circuit board assembly 61, transistors 64 and 71 are oriented so that the proper connections are made to the respective emitters and collectors. This orientation is by virtue of designing the emitter to the right of the indexing tab 32 and the collector to the left thereof. In some devices, such as transistors and diodes, it is also preferred or necessary to orient the devices from top to bottom to insure proper connection in a circuit board. To facilitate such orientation it is preferred to make one of the upper and lower electrodes from a magnetic material and the other from a nonmagnetic material. Thus the devices may be automatically magnetically oriented top to bottom for assembling into a circuit board assembly. With magnetic top to bottom orientation and an indexing tab for indexing respective electrode portions on one surface of a device, precise component orientation is obtainable.

The intermediate electrically conductive sheet 48 has heretofore been described as an oxidized copper surface for bonding the upper board 51 to the lower board 58. This copper sheet 48 may serve an additional function of conducting heat from within the board which has been generated by the various devices. Additional thermal connections to the sheet 48 may be made in any suitable fashion. The sheet may extend from the edge of the surface board assembly 61, as shown in FIGS. 9 and 10, to dissipate heat.

In some circuit designs it is desired to supply a common ground to a plurality of devices in the circuit. In the circuit board assembly 61 the electrically conductive sheet 48 may be utilized as such a common ground.

To protect a circuit board assembly it is preferred to coat the exposed circuit elements, except for terminal portions. This is preferably done by spray coating with a transparent insulative material, not shown.

The circuit board assembly hereinbefore described lends itself to volume production of upper and lower circuit boards with appropriate electrically conductive circuit patterns etched in the respective upper and lower conductive sheets 53 and 49 thereof. It also lends itself to automatic assembly of components into the respective holes in the circuit board assembly; and where desired, to replacement of individual components by the procedure of punching out from a hole and replacing it with an alternate. This may be done by attaching the electrodes thereof to the desired appropriate portions of the upper and lower electrically conductive sheets with a suitable circuit patch. It is also possible to assemble duplicate components into the circuit where limited life, or early failure, is contemplated, and, upon failure of one of said components, the surface connections thereto may easily be cut and replaced with connections to the alternate component. It will of course be appreciated that in the foregoing assembly a portion of each component is exposed through upper and lower holes in the assembly 61, so that cooling of the assembly may be facilitated by a heat transfer medium such as air passed across the respective upper and lower surfaces of the assembly.

What is claimed is:

1. A circuit board assembly comprising, in combination: a sheet of electrically insulative material having a plurality of holes transversely thereof; electrically conductive material bonded to the outer surfaces of said sheet and having adjacent said holes overlying tabs, electric circuit elements in a plurality of said holes, each having its opposite ends retained in said holes by said tabs, and each said electric circuit element being electrically connected to at least two of said tabs.

2. An assembly according to claim 1 wherein at least one electric circuit element is electrically connected to two of said tabs adjacent a common end of the hole containing the element.

3. A circuit board assembly according to claim 1 and comprising an electrically conducting sheet interposed within said insulating sheet and electrically connected to at least one of said electric circuit elements.

4. A circuit board element comprising; in combination:

a sheet of electrically insulative material having a plurality of holes therein transversely of the sheet, said holes being noncircular whereby noncircular components may be oriented in said noncircular holes;

an electrically conductive sheet physically bonded to one surface of said insulative material and extending over a portion only of at least some of said holes.

5. A circuit board according to claim 4 wherein said holes are circular with an additional recess formed in communication therewith whereby circular components may be inserted without orientation and noncircular components may be inserted with orientation.

6. A circuit board element comprising, in combination:

a sheet of electrically insulative material having a plurality of holes therein transversely of the sheet;

an electrically conductive sheet physically bonded to one surface of said insulative material and extending over a portion only of at least some of said holes; and a second electrically conductive sheet bonded to a second surface of said insulative material and electrically isolated from said first mentioned electrically conductive sheet, said scond electrically conductive sheet having holes in register with at least some of the holes in the electrically insulative material.

References Cited in the file of this patent

UNITED STATES PATENTS

| | | |
|---|---|---|
| 2,066,511 | Arlt | Jan. 5, 1937 |
| 2,244,009 | Hiensch et al. | June 3, 1941 |
| 2,586,854 | Myers | Feb. 26, 1952 |
| 2,694,249 | Kapp | Nov. 16, 1954 |
| 2,756,485 | Abramson et al. | July 31, 1956 |
| 2,869,041 | DeCola | Jan. 13, 1959 |
| 2,889,393 | Berger | June 2, 1959 |
| 2,902,628 | Leno | Sept. 1, 1959 |
| 2,910,675 | Gessner | Oct. 27, 1959 |
| 2,917,678 | Tepper | Dec. 15, 1959 |
| 3,052,823 | Anderson et al. | Sept. 4, 1962 |